United States Patent [19]

Blauschild

[11] Patent Number: 4,542,305
[45] Date of Patent: Sep. 17, 1985

[54] IMPEDANCE BUFFER WITH REDUCED SETTLING TIME

[75] Inventor: Robert A. Blauschild, Los Altos, Calif.

[73] Assignee: Signetics Corporation, Sunnyvale, Calif.

[21] Appl. No.: 468,754

[22] Filed: Feb. 22, 1983

[51] Int. Cl.[4] .................... H03K 19/092; G11C 27/02
[52] U.S. Cl. ............................... 307/353; 307/296 R; 307/475; 307/491; 307/503
[58] Field of Search ............... 307/353, 475, 491, 503, 307/296 R

[56] References Cited

U.S. PATENT DOCUMENTS 3,831,040  8/1974  Nanba et al. ..................... 307/296
4,109,215  8/1978  Comer et al. ..................... 307/353
4,321,488  3/1982  Srivastava ......................... 307/353

Primary Examiner—John Zazworsky
Attorney, Agent, or Firm—R. J. Meetin; R. T. Mayer; T. A. Briody

[57] ABSTRACT

A bipolar impedance buffer contains an input transistor (Q1) whose emitter is coupled to that of a like-polarity intermediate transistor (QN). Its collector is coupled to the base of a like-polarity output transistor (QO), while its base is coupled to the collector of an opposite-polarity transistor (QP). A resistor (RN) coupled between the base and collector of the intermediate transistor significantly reduces the output settling time.

7 Claims, 4 Drawing Figures

IMPEDANCE BUFFER WITH REDUCED SETTLING TIME

FIELD OF USE

This invention relates to impedance buffers particularly suitable for various types of semiconductor integrated circuits including sample-and-hold circuits.

BACKGROUND ART

In many situations, a signal supplied from an output of one circuit to an input of a second circuit may have to be at so high a current level to meet the demands of the second circuit that the first circuit is detrimentally affected. To alleviate this problem, an impedance buffer is typically placed between the output of the first circuit and the input of the second circuit. The impedance buffer has a high input impedance so as to draw little current from the first circuit but a low output impedance that enables the current level of the signal from the first circuit to be raised high enough to meet the requirements of the second circuit without harming the first. Often, the impedance buffer also acts as a voltage follower in that it changes the voltage level of the signal transmitted between the circuits by a known amount.

FIG. 1 illustrates a known bipolar impedance buffer for converting an input signal $V_I$ at a low current level into an output signal $V_O$ at a high current level. Output $V_O$ is at the same voltage level as input $V_I$ here. However, a conventional voltage-following element might be included at any of several points in this buffer so as to cause output $V_O$ to differ from input $V_I$ by a known voltage.

In this buffer, input $V_I$ is supplied to the base of an NPN input transistor Q1 whose collector is connected to a source of a high supply voltage $V_{CC}$ and whose emitter is connected through a node N1 to the emitter of a diode-connected NPN transistor QJ. The interconnected base and collector of transistor QJ are connected to the emitter of an intermediate NPN transistor QN whose base and collector are connected together through a node N2 to the base of an NPN output transistor QO. Its emitter supplies output $V_O$, while its collector is connected to the $V_{CC}$ supply. The interconnected base and collector of transistor QN are also connected to the collector of a PNP transistor QP whose emitter is connected to the $V_{CC}$ supply. A bias voltage $V_B$ is supplied to the base of transistor QP to make it conduct a current $I_p$. A current source 5 is connected between node N1 and a source of a low supply voltage $V_{EE}$. Another current source 6 is connected between the $V_{EE}$ supply and the emitter of transistor QO.

When input $V_I$ changes rapidly, the voltage at the QP collector also changes rapidly. This change is partially transmitted across the QP base-emitter junction due to internal device parasitics and resistance in the $V_B$ line and causes a transient change in the current $I_p$. In turn, this causes a transient error in output $V_O$. After a while, current $I_p$ settles back to its nominal value. However, the settling time is relatively long because PNP base-emitter capacitances, particularly the QP base-emitter capacitance, are typically very large. Output $V_O$ thus takes a relatively long time to settle back to its nominal value. This is disadvantageous in high-speed applications.

DISCLOSURE OF THE INVENTION

In accordance with the invention, an impedance buffer generally of the foregoing type contains a strategically located resistor for reducing the output settling time. This makes the present buffer significantly faster than otherwise comparable prior art buffers.

More particularly, the present buffer contains three first-polarity bipolar transistors and an opposite second-polarity bipolar transistor. The first-polarity transistors are referred to as the input transistor, the intermediate transistor, and the output transistor. A first current source is coupled between a first voltage supply and a node coupled to the emitter of the input transistor. Its collector is coupled to a second voltage supply. The node is further coupled to the emitter of the intermediate transistor whose collector is coupled to the base of the output transistor. Its emitter is coupled to a second current source coupled to the first voltage supply, while its collector is coupled to the second voltage supply. The base of the intermediate transistor is coupled to the collector of the second-polarity transistor whose emitter is also coupled to the second voltage supply. The resistor is coupled between the collector of the intermediate transistor and the collector of the second-polarity transistor.

The resistor improves the output settling time in the following manner. When the voltage at the base of the input transistor changes rapidly, the current $I_p$ through the second-polarity transistor also changes by a transient amount $\Delta I_p$ that flows through the intermediate and input transistors. Where the transconductance of each of them is $G_{MJ}$ (which may vary from one to the other), each contributes an amount $\Delta I_p/G_{MJ}$ to a transient error term in the output voltage at the output transistor. The change $\Delta I_p$ also flows through the resistor. This results in a transient voltage which opposes the total output error that would otherwise occur. For each of the input and intermediate transistors, its error contribution is cancelled by a partial resistance of $1/G_{MJ}$ for the resistor. Accordingly, the transient output error is cancelled by the voltage change across the resistor if its resistance is the sum of the $1/G_{MJ}$ partial resistances. Since the base-emitter capacitance for a PNP transistor is generally greater than for an NPN transistor, the performance improvement for the present impedance buffer is greater when the second-polarity transistor is a PNP device.

In general, one or more first-polarity diode-connected further bipolar transistors may be emitter-collector coupled between the node and the emitter of the input transistor. One or more first-polarity diode-connected further bipolar transistors may also be emitter-collector coupled between the node and the emitter of the intermediate transistor. Let $N-2$ be the number of further transistors in series between the node and the emitter of the input transistor plus the number of further transistors in series between the node and the emitter of the intermediate transistor. Each further transistor contributes $\Delta I_p/G_{MJ}$ to the transient output error term where $G_{MJ}$ now also represents the transconductance of each of the $N-2$ further transistors. Each of their contributions is likewise cancelled by a partial resistance of $1/G_{MJ}$. The voltage change across the resistor then cancels the output voltage error if the value of the resistor is adjusted to be the sum of the N partial resistances of $1/G_{MJ}$.

While the present impedance buffer may be used in many circuits, it is particularly useful in a sample-and-hold circuit which converts an input signal into an output signal in response to a sample signal and then holds the output signal at its latest value in response to a hold signal. In addition to the present buffer which receives the input signal, the sample-and-hold circuit contains a bias circuit for suitably biasing the second-polarity transistor. A capacitor is coupled between the emitter of the output transistor and a third voltage supply. An output circuit coupled to the output transistor provides the output signal. In response to the hold signal, a switch electronically decouples the input transistor from the intermediate transistor; the switch also electronically decouples the capacitor from the first and second voltage supplies. As a result, the capacitor remains charged at the level existing just before the hold signal so as to cause the output circuit to hold the output signal. Because the resistor is included in the buffer of the sample-and-hold circuit, its response time is much less than that of otherwise comparable prior art circuits.

BRIEF DESCRIPTION OF THE DRAWINGS

Like reference symbols are employed in the drawings and the description of the preferred embodiments to represent the same or very similar item or items.

DESCRIPTION OF THE PREFERRED EMBODIMENTS

Figure 1:
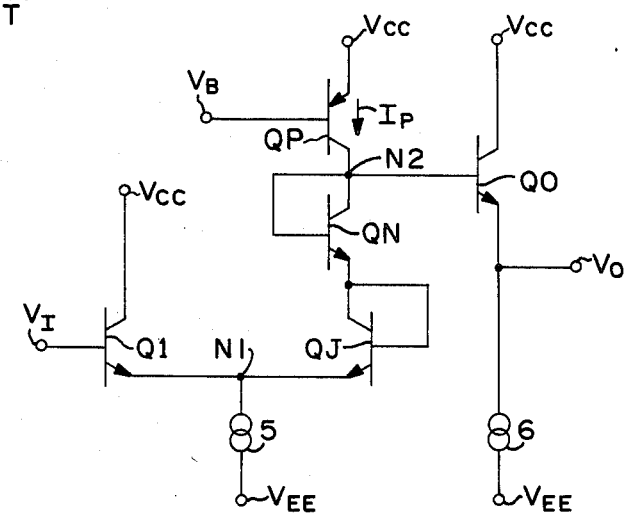
FIG. 1 is a circuit diagram of a prior art impedance buffer.
Figure 2:
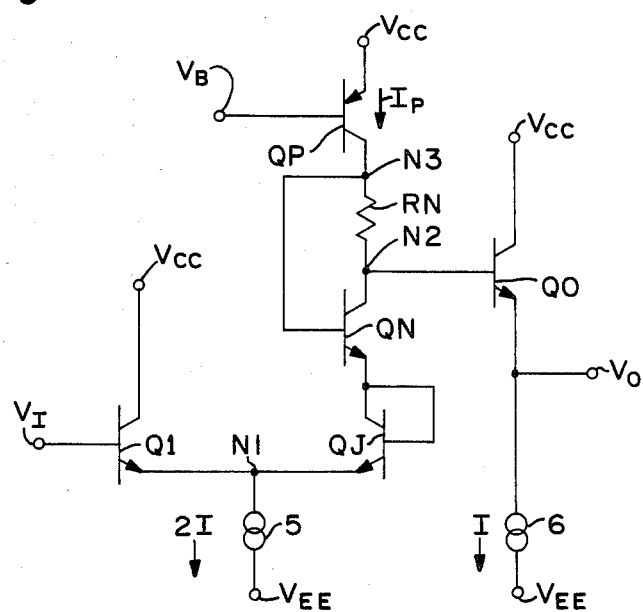
FIG. 2 is a circuit diagram of an embodiment of an impedance buffer in accordance with the invention.

Turning to FIG. 2, it illustrates a bipolar impedance buffer for converting input voltage signal $V_I$ into output signal $V_O$ at the same voltage level but a higher current level. This buffer contains NPN input transistor Q1, diode-connected NPN transistor QJ, NPN intermediate transistor QN, NPN output transistor QO, PNP transistor QP, current source 5, and current source 6. Elements Q1, QJ, QO, 5, and 6 are all configured as shown here in FIG. 2 and also as shown and described above for FIG. 1. Likewise, transistor QN has its emitter coupled to the QJ collector and its collector coupled through node N2 to the QO base, while bias voltage $V_B$ is supplied to the base of transistor QP whose emitter is coupled to the $V_{CC}$ supply. Transistors Q1, QJ, QN, and QO have equal emitter areas. As a result, the current through source 5 is twice the current I through source 6.

Importantly, a resistor RN is connected between the base and collector of transistor QN. This connection is so arranged that resistor RN is connected between the base of transistor QO through node N2 and the collector of transistor QP through a node N3.

When input voltage $V_I$ changes rapidly, resistor RN reduces the transient $V_O$ output settling error that would otherwise occur as the current $I_p$ through transistor QP changes by amount $\Delta I_p$ that flows through transistors QN and QJ and also through transistor Q1. The contribution to the $V_O$ output settling error from each transistor Q1, QJ, or QN is $\Delta I_p/G_M$. The transconductance $G_M$ equals $Iq/kT$, where q is the electronic charge, k is Boltzmann's constant, and T is the (buffer) temperature. The $V_O$ output error term resulting from transistors Q1, QJ, and QN is then $3\Delta I_p/G_M$. Current change $\Delta I_p$ also flows through resistor RN whose resistance is $R_N$. The voltage change $R_N\Delta I_p$ across resistor RN acts to negate the $V_O$ error term. The $V_O$ output settling error is cancelled when set equal to the voltage change across resistor RN. Accordingly, the optimum value for $R_N$ is $3/G_M$.

Transistor QJ could be deleted from the buffer of FIG. 2. The emitter of transistor QN is then connected directly to node N1. Output $V_O$ is then about $1V_{BE}$ below input $V_I$. $V_{BE}$, which is the voltage across the base-emitter junction of a bipolar transistor when it is just conductively forward biased, is about 0.7 volt here. With the deletion of transistor QJ, its contribution to the $V_O$ output settling error is also absent. Moreover, the circuit parameters can be chosen such that the Q1 transconductance differs from the QN transconductance. The optimum $R_N$ value for cancelling the $V_O$ error term caused now by transistors Q1 and QN is the sum of their individual $1/G_{MJ}$ contributions where $G_{MJ}$ is the particular transconductance of transistor Q1 or QN.

Figure 3:
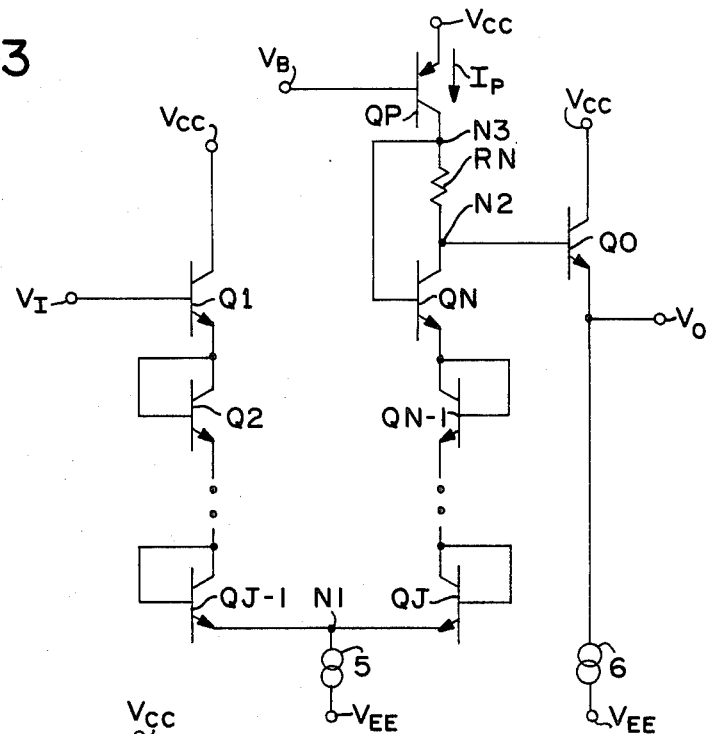
FIG. 3 is a circuit diagram of another embodiment of an impedance buffer in accordance with the invention.

More generally, the above principle applies to the situation in which current change $\Delta I_p$ flows through a set of N NPN transistors arranged in the manner shown in the impedance buffer of FIG. 3. Diode-connected transistors Q2, . . . and QJ−1 are serially connected between the Q1 emitter and node N1. Likewise, diode-connected transistors QJ, . . . and QN−1 are serially connected between node N1 and the QN emitter. Let $G_{MJ}$ be the transconductance of the Jth transistor in this set. In accordance with the foregoing analysis, the $V_O$ output error term is the sum of the N contributions of $\Delta I_p/G_{MJ}$ from transistors Q1−QN. Setting $R_N$ equal to $$\sum_{J=1}^{N} 1/G_{MJ}$$

cancels this term.

Figure 4:
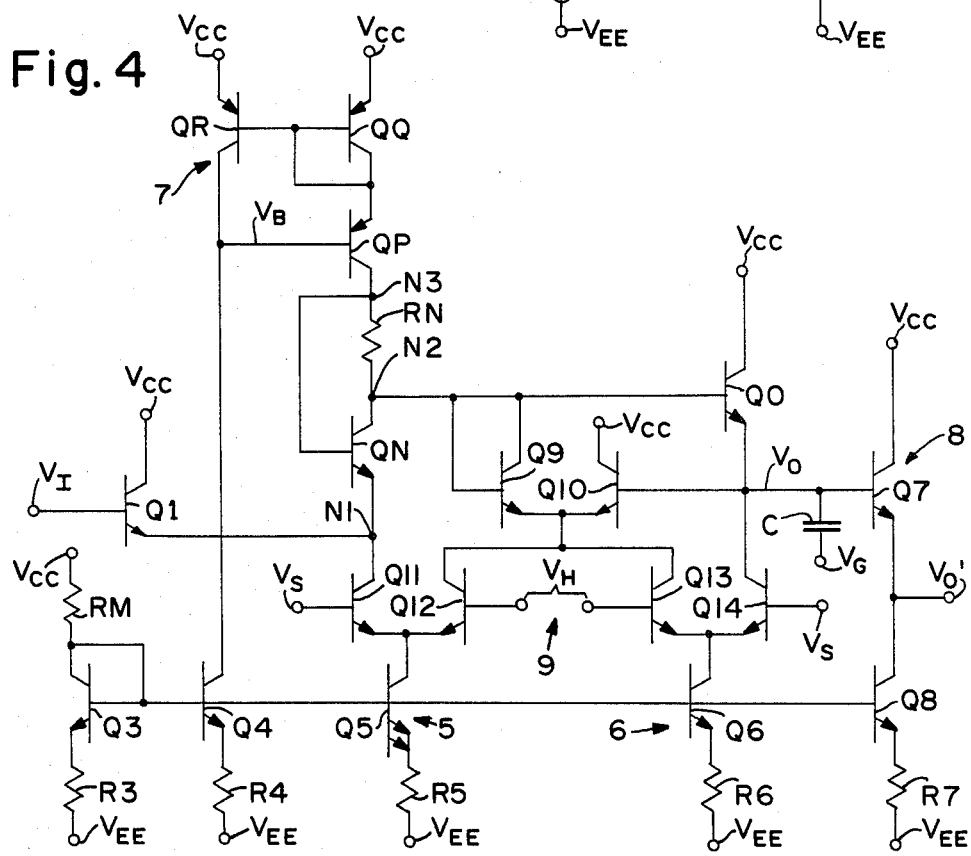
FIG. 4 is a circuit diagram of a sample-and-hold-/level shift circuit configured with an impedance buffer of the invention.

Moving on to FIG. 4, it shows a sample-and-hold-/level shift circuit containing an impedance buffer suitably containing transistors Q1, QN, QO, and QP, current sources 5 and 6, and resistor RN arranged as shown. This circuit contains a bias circuit 7 for providing voltage $V_B$ to the QP base, a capacitor C connected between the QO emitter and a supply of a voltage $V_G$, an output circuit 8 connected to the QO emitter for providing an output voltage signal $V_O'$ in response to a sample signal $V_S$, and a switch 9 responsive to a hold signal $V_H$ complementary to sample signal $V_S$ for electronically decoupling (a) transistor Q1 from transistor QN and (b) capacitor C from the $V_{EE}$ and $V_{CC}$ supplies so as to cause output $V_O'$ to be held at its latest value. As a matter of choice, all the NPN transistors in FIG. 4 have the same emitter area unless otherwise indicated; likewise, all the PNP transistors have the same emitter area.

Bias circuit 7 consists of a pair of PNP transistors QQ and QR arranged as a current mirror. The current through transistor QQ whose base is connected to its collector is mirrored in transistor QR whose collector provides bias $V_B$ at $1V_{BE}$ below $V_{CC}$. The current for transistor QR is provided from a current mirror consisting of NPN transistors Q3 and Q4, respective emitter resistors R3 and R4, and a collector resistor RM for transistor Q3, all arranged as shown. The current through transistor Q3 whose collector is connected to its base is mirrored in transistor Q4 which supplies the QR current.

For the buffer, current source 5 consists of an NPN transisor Q5 and its emitter resistor R5. Likewise, current source 6 consists of an NPN transistor Q6 and its emitter resistor R6. So as to enable transistor Q5 to conduct twice as much current as transistor Q6, transistor Q5 has twice the emitter area of transistor Q6. Although represented as having multiple emitters, transistor Q5 is preferably laid out as a pair of parallel transistors each having the same emitter area as transistor Q6. Transistor Q6 operates as a current mirror in conjunction with transistor Q3. In a similar manner, transistor Q5 operates as a doubling current mirror in combination with transistor Q3.

In output circuit 8, output $V_O'$ is provided from the emitter of an NPN transistor Q7 whose base is connected to the QO emitter. The current for transistor Q7 is supplied from a current source consisting of an NPN transistor Q8 and its emitter resistor R7 arranged as shown. Transistor Q8 operates as a current mirror in combination with transistor Q3.

Switch 9 consists of a pair of clamping NPN transistors Q9 and Q10, a pair of switching NPN transistors Q11 and Q12, and a pair of switching NPN transistors Q13 and Q14, all arranged as shown. The bases of transistors Q11 and Q14 receive signal $V_S$, while the bases of transistors Q12 and Q13 receive signal $V_H$.

When signal $V_S$ is at a suitable high voltage during the sampling operation, transistors Q11 and Q14 are turned on. Signal $V_H$ is at a sufficiently low voltage to turn off transistors Q12 and Q13. This cuts off the operating current for transistors Q9 and Q10 so as to turn them off and prevent them from affecting transistor QO. Accordingly, there is a signal path through transistors Q1, QN, QO, and Q7 so as to allow output $V_O'$ to follow input $V_I$.

Signal $V_S$ goes to the low voltage at the beginning of the holding operation to turn off transistors Q11 and Q14. The turning off of transistor Q11 effectively disconnects transistor Q1 and QN as their emitter currents are cut off, forcing them to turn off. The turning off of transistor Q14 effectively decouples capacitor C from the $V_{EE}$ supply by way of the path through transistor Q6. This prevents capacitor C from discharging toward voltage $V_{EE}$. Signal $V_H$ goes to the high voltage to turn on transistors Q12 and Q13. This restores the operating current to transistors Q9 and Q10 to enable them to turn on. The QO base-emitter voltage is thereby clamped at approximately 0 volt so as to decouple capacitor C from the $V_{CC}$ supply by way of the path through transistor QO. This prevents capacitor C from rising toward voltage $V_{CC}$. As a result, capacitor C remains charged to the level that existed at the instant that signal $V_H$ went high. Ignoring the slow discharge of capacitor C to voltage $V_G$ due to leakage, transistor Q7 is maintained at the conductive state existing when signal $V_H$ went high. Output $V_O'$ is then held at the latest value.

In a preferred embodiment of this sample-and-hold-/level shift circuit, resistor RN is 104 ohms. Resistors R3, R4, R6, and R7 are each 400 ohms while resistor R5 is 200 ohms (formed by two 400-ohm resistors in parallel). Resistor RM is 20,000 ohms. Capacitor C is 20 picofarads. Voltages $V_{EE}$, $V_G$, and $V_{CC}$ are $-5$, 0, and 5 volts, respectively.

Methods for manufacturing the various elements of the present impedance buffer and sample-and-hold-/level shift circuit are well known in the semiconductor art. Each is preferably fabricated as part of a monolithic integrated circuit using PN junction isolation to separate active regions in a semiconductor wafer.

While the invention has been described with reference to particular embodiments, this description is solely for the purpose of illustration and is not to be construed as limiting the scope of the invention claimed below. For example, semiconductor elements of opposite polarity to those described above may be employed to accomplish the same results. Thus, various modifications, changes, and applications may be made by those skilled in the art without departing from the true scope and spirit of the invention as defined by the appended claims.

What is claimed is:

1. A buffer containing a first-polarity input transistor, a first-polarity intermediate transistor, a first-polarity output transistor, a second-polarity transistor where the second polarity is opposite to the first polarity, a first current source coupled between a first voltage supply and a node, and a second current source coupled to the first voltage supply, wherein each transistor is a bipolar transistor having an emitter, a base, and a collector, the input transistor has its emitter coupled to the node and its collector coupled to a second voltage supply, the intermediate transistor has its emitter coupled to the node and its collector coupled to the base of the output transistor whose emitter is coupled to the second current source and whose collector is coupled to the second voltage supply, the second-polarity transistor has its emitter coupled to the second voltage supply and its collector coupled to the base of the intermediate transistor, and means couples the collectors of the intermediate and second-polarity transistors, characterized in that the means comprises a resistor.

2. A buffer as in claim 1 characterized in that the resistance of the resistor is approximately the sum of the inverses of the transconductances of the input and intermediate transistors.

3. A buffer as in claim 2 characterized in that the second polarity is PNP.

4. A buffer as in claim 1 characterized by at least one first-polarity diode-connected further bipolar transistor emitter-collector coupled respectively between the node and the emitter of a least one of the input and intermediate transistors.

5. A buffer as in claim 4 characterized in that:
$N-2$ is the number of further transistors in series between the node and the emitter of the input transistor plus the number of further transistors in series between the node and the emitter of the intermediate transistor; and
the resistance of the resistor is approximately the sum of the inverses of the transconductances of the input, further, and intermediate trnasistors.

6. A buffer as in claim 5 characterized in that the second polarity is PNP.

7. A sample-and-hold circuit for converting an input signal into an output signal in response to a sample signal and then holding the output signal at its latest value in response to a hold signal, the sample-and-hold circuit comprising:
a buffer as in claim 1 in which the input signal is supplied to the base of the input transistor;

bias means for providing a bias voltage to the base of the second-polarity transistor;

a capacitor coupled between the emitter of the output transistor and a third voltage supply;

output means coupled to the output transistor for providing the output signal; and switching means responsive to the hold signal (a) for preventing the input signal from significantly affecting the output transistor and (b) for electronically decoupling the capacitor from the first and second voltage supplies.

* * * * *